United States Patent
Han

(10) Patent No.: US 10,249,602 B2
(45) Date of Patent: Apr. 2, 2019

(54) LIGHT EMITTING DIODE DISPLAY AND MANUFACTURE METHOD THEREOF

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 49 days.

(21) Appl. No.: 15/519,838

(22) PCT Filed: Mar. 15, 2017

(86) PCT No.: PCT/CN2017/076779
§ 371 (c)(1),
(2) Date: Apr. 18, 2017

(87) PCT Pub. No.: WO2018/152894
PCT Pub. Date: Aug. 30, 2018

(65) Prior Publication Data
US 2018/0301441 A1    Oct. 18, 2018

(30) Foreign Application Priority Data
Feb. 24, 2017 (CN) .......................... 2017 1 0104790

(51) Int. Cl.
*H01L 25/16* (2006.01)
*H01L 27/12* (2006.01)
(Continued)

(52) U.S. Cl.
CPC .......... *H01L 25/167* (2013.01); *H01L 27/124* (2013.01); *H01L 27/1248* (2013.01);
(Continued)

(58) Field of Classification Search
CPC .............. H01L 27/167; H01L 27/1248; H01L 27/1262; H01L 33/405; H01L 33/42; H01L 33/44; H01L 33/46
See application file for complete search history.

(56) References Cited

U.S. PATENT DOCUMENTS

| 2013/0001601 A1* | 1/2013 | Lee ..................... H01L 51/5203 |
| | | 257/88 |
| 2014/0117363 A1* | 5/2014 | Koresawa ........... H01L 27/3274 |
| | | 257/59 |

(Continued)

FOREIGN PATENT DOCUMENTS

| CN | 103441138 A | 12/2013 |
| CN | 104953044 A | 9/2015 |
| CN | 106206672 A | 12/2016 |

*Primary Examiner* — Phuc Dang
(74) *Attorney, Agent, or Firm* — Leong C. Lei

(57) ABSTRACT

The present invention provides a light emitting diode display and a manufacture method thereof. The manufacture method of the light emitting diode display according to the present invention arranges an anode contact layer to increase the contact area of the second anode of the light emitting diode and the first anode of the TFT backplate to ensure the fine contact between the second anode and the first anode for avoiding the problem that the second anode and the first anode are in bad contact due to the poor welding for stabilizing the luminous performance of the light emitting diode to promote the display quality of the light emitting diode display; furthermore, the present application uses ink jet printing to form the anode contact layer and the cathode insulation layer, and the manufacture process is simple and the production cost is low.

14 Claims, 7 Drawing Sheets

(51) Int. Cl.
*H01L 33/44* (2010.01)
*H01L 33/40* (2010.01)
*H01L 33/62* (2010.01)
*H01L 33/42* (2010.01)
*H01L 51/52* (2006.01)
*H01L 51/56* (2006.01)
*H01L 27/32* (2006.01)

(52) U.S. Cl.
CPC ...... *H01L 27/1262* (2013.01); *H01L 27/3253* (2013.01); *H01L 33/405* (2013.01); *H01L 33/42* (2013.01); *H01L 33/44* (2013.01); *H01L 33/62* (2013.01); *H01L 51/5212* (2013.01); *H01L 51/5218* (2013.01); *H01L 51/56* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 2015/0144909 A1 | 5/2015 | Byun et al. |
| 2016/0118453 A1* | 4/2016 | Cho .................... H01L 27/3225 257/40 |
| 2017/0047313 A1* | 2/2017 | Yang ....................... H01L 23/15 |

* cited by examiner providing a TFT backplate and a light emitting diode; the TFT backplate comprising a substrate, a TFT layer located on the substrate, a first planarization layer located on the TFT layer, a first anode located on the first planarization layer, a second planarization layer located on the first anode and the first planarization layer and a first through hole being located on the second planarization layer and exposing at least a portion of the first anode; the light emitting diode comprising a luminous lamp and a second anode and a second cathode respectively connected to two ends of the luminous lamp —1

↓ transferring the light emitting diode into the first through hole of the TFT backplate, and connecting the second anode of the light emitting diode with the first anode of the TFT backplate —2

↓ forming an anode contact layer, which is around the light emitting diode and on the first anode, inside the first through hole of the TFT backplate —3

↓ forming a cathode insulation layer, which is around the light emitting diode and on the anode contact layer, inside the first through hole of the TFT backplate —4

↓ forming a first cathode on the cathode insulation layer, the light emitting diode and the second planarization layer, and the first cathode contacting with the second cathode —5

Fig. 2

LIGHT EMITTING DIODE DISPLAY AND MANUFACTURE METHOD THEREOF

FIELD OF THE INVENTION

The present invention relates to a display technology field, and more particularly to a light emitting diode display and a manufacture method thereof.

BACKGROUND OF THE INVENTION

With the progress of the technology, various display products have already been developed in the market, such as the Liquid Crystal Display (LCD), the Plasma Display Panel (PDP) and the Light Emitting Diode display (LED display). The LED display possesses the advantages of high luminous efficiency, long life and low energy consumption, and has been widely applied for the outdoor displays and the large outdoor billboards, and also exists in the displays of the home television and the computer.

The light emitting diode display is a display screen with a way of controlling the display of the semiconductor light emitting diode for showing kinds of information, such as words, graphics, images, animation, quotes, video and recording tape signals.

The technological progress of light emitting diodes is the biggest driving force to expand the market demand and application. At first, the light emitting diode is only used for micro indicator to be applied in the high-end equipments of the computer, audio and video recorders. With the development of large scale integrated circuits and computer technology, the light emitting diode displays are rapidly rising and gradually expanded in the fields of stock quotes, digital cameras, personal digital assistant (PDA), and mobile phones.

The LED display integrates the microelectronics technology, the computer technology, the information process in one, and possesses advantages of colorfulness, wide dynamic range, high brightness, high resolution, low operating voltage, low power consumption, long life, impact resistance, and stable and reliable work to become the new generation display media with the most advantage. The light emitting diode display has been widely applied in the large square, commercial advertisement, sports venues, information dissemination, press release and securities trade for satisfying requirements of various environments.

FIG. 1 is a structure diagram of a light emitting diode display according to prior art. As shown in FIG. 1, the light emitting diode display comprises a substrate 100, a thin film transistor (TFT) layer 200 located on the substrate 100, a first planarization layer 300 located on the TFT layer 200, a first anode 400 located on the first planarization layer 300, a second planarization layer 500 located on the first anode 400 and the first planarization layer 300, a first through hole 510 being located in the second planarization layer 500 and exposing the first anode 400, a light emitting diode 600 located inside the first through hole 51, a cathode insulation layer 720, which is around the light emitting diode 600 and on the first anode 400, located inside the first through hole 510, and a first cathode 730 located on the cathode insulation layer 720, the light emitting diode 600 and the second planarization layer 500;

the light emitting diode 600 comprises a luminous lamp 610 and a second anode 620 and a second cathode 630 respectively connected to two ends of the luminous lamp 610, and the second anode 620 connects with the first anode 400, and the second cathode 630 contacts with the first cathode 730, and the first anode 400 and the first cathode 730 are insulated by the cathode insulation layer 720.

Generally, the manufacture method of the aforesaid light emitting diode display comprises:

step 1', providing a TFT backplate 800 and a light emitting diode 600;

the TFT backplate 800 comprising a substrate 100, a TFT layer 200 located on the substrate 100, a first planarization layer 300 located on the TFT layer 200, a first anode 400 located on the first planarization layer 300, a second planarization layer 500 located on the first anode 400 and the first planarization layer 300 and a first through hole 510 being located on the second planarization layer 200 and exposing at least a portion of the first anode 400;

the light emitting diode 600 comprising a luminous lamp 610 and a second anode 620 and a second cathode 630 respectively connected to two ends of the luminous lamp 610;

step 2', transferring the light emitting diode 600 into the first through hole 510 of the TFT backplate 800, and connecting the second anode 620 of the light emitting diode 600 with the first anode 400 of the TFT backplate 800 by welding.

step 3', forming a cathode insulation layer 720, which is around the light emitting diode 600 and on the first anode 400, inside the first through hole 510 of the TFT backplate 800;

step 4', forming a first cathode 730 on the cathode insulation layer 720, the light emitting diode 600 and the second planarization layer 500, and the first cathode 730 contacts with the second cathode 630.

In step 2' of the aforesaid manufacture method of the light emitting diode, because the second anode 620 of the light emitting diode 600 is connected with the first anode 400 of the TFT backplate 800 by welding, the condition that the second anode 620 and the first anode 400 are in bad contact due to the poor welding may easily occur to result in that the illumination of the light emitting diode 600 is influenced.

In step 3' of the aforesaid manufacture method of the light emitting diode, a combination of the organic material coating process and the photolithography process is generally used to form the cathode insulation layer 720. The photolithography process requires one mask, and thus the mask cost is increased to lead to the high production cost.

SUMMARY OF THE INVENTION

An objective of the present invention is to provide a manufacture method of a light emitting diode display, which can avoid the problem that the second anode and the first anode are in bad contact due to the poor welding for stabilizing the luminous performance to promote the display quality of the light emitting diode display.

Another objective of the present invention is to provide a light emitting diode display, of which the luminous performance is stable to possess the better display quality.

For realizing the aforesaid objectives, the present invention first provides a manufacture method of a light emitting diode display, comprising steps of:

step 1, providing a TFT backplate and a light emitting diode;

the TFT backplate comprising a substrate, a TFT layer located on the substrate, a first planarization layer located on the TFT layer, a first anode located on the first planarization layer, a second planarization layer located on the first anode and the first planarization layer and a first through hole being located on the second planarization layer and exposing at least a portion of the first anode;

the light emitting diode comprising a luminous lamp and a second anode and a second cathode respectively connected to two ends of the luminous lamp;

step 2, transferring the light emitting diode into the first through hole of the TFT backplate, and connecting the second anode of the light emitting diode with the first anode of the TFT backplate;

step 3, forming an anode contact layer, which is around the light emitting diode and on the first anode, inside the first through hole of the TFT backplate; the anode contact layer contacting with the second anode and not contacting with the second cathode;

step 4, forming a cathode insulation layer, which is around the light emitting diode and on the anode contact layer, inside the first through hole of the TFT backplate;

step 5, forming a first cathode on the cathode insulation layer, the light emitting diode and the second planarization layer, and the first cathode contacting with the second cathode.

The TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

a third through hole is configured on the first planarization layer, and the first anode contacts with the drain via the third through hole.

In step 2, welding is used to connect the second anode of the light emitting diode with the first anode of the TFT backplate.

In step 3, ink jet printing is used to form the anode contact layer; a material of the anode contact layer comprises one or more of nano silver and nano copper.

In step 4, ink jet printing is used to form the cathode insulation layer; a material of the cathode insulation layer is organic insulation material.

In step 5, evaporation is used to form the first cathode; the first anode is a reflective electrode; the first cathode is a transparent electrode.

The present invention further provides a light emitting diode display, comprising a substrate, a TFT layer located on the substrate, a first planarization layer located on the TFT layer, a first anode located on the first planarization layer, a second planarization layer located on the first anode and the first planarization layer, a first through hole being located on the second planarization layer and exposing at least a portion of the first anode, a light emitting diode located inside the first through hole, an anode contact layer, which is around the light emitting diode and on the first anode, located inside the first through hole, a cathode insulation layer, which is around the light emitting diode and on the anode contact layer, located inside the first through hole, and a first cathode located on the cathode insulation layer, the light emitting diode and the second planarization layer;

the light emitting diode comprising a luminous lamp and a second anode and a second cathode respectively connected to two ends of the luminous lamp, and the second anode connecting with the first anode, and the second cathode contacting with the first cathode;

the anode contact layer contacting with the second anode and not contacting with the second cathode; the anode contact layer and the first cathode are insulated by the cathode insulation layer.

The TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

a third through hole is configured on the first planarization layer, and the first anode contacts with the drain via the third through hole.

A material of the anode contact layer comprises one or more of nano silver and nano copper; a material of the cathode insulation layer is organic insulation material.

The first anode is a reflective electrode; the first cathode is a transparent electrode.

The present invention further provides a manufacture method of a light emitting diode display, comprising steps of:

step 1, providing a TFT backplate and a light emitting diode;

the TFT backplate comprising a substrate, a TFT layer located on the substrate, a first planarization layer located on the TFT layer, a first anode located on the first planarization layer, a second planarization layer located on the first anode and the first planarization layer and a first through hole being located on the second planarization layer and exposing at least a portion of the first anode;

the light emitting diode comprising a luminous lamp and a second anode and a second cathode respectively connected to two ends of the luminous lamp;

step 2, transferring the light emitting diode into the first through hole of the TFT backplate, and connecting the second anode of the light emitting diode with the first anode of the TFT backplate;

step 3, forming an anode contact layer, which is around the light emitting diode and on the first anode, inside the first through hole of the TFT backplate; the anode contact layer contacting with the second anode and not contacting with the second cathode;

step 4, forming a cathode insulation layer, which is around the light emitting diode and on the anode contact layer, inside the first through hole of the TFT backplate;

step 5, forming a first cathode on the cathode insulation layer, the light emitting diode and the second planarization layer, and the first cathode contacting with the second cathode;

wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

a third through hole is configured on the first planarization layer, and the first anode contacts with the drain via the third through hole;

wherein in step 2, welding is used to connect the second anode of the light emitting diode with the first anode of the TFT backplate.

The benefits of the present invention are: the manufacture method of the light emitting diode display according to the present invention arranges an anode contact layer to increase the contact area of the second anode of the light emitting diode and the first anode of the TFT backplate to ensure the fine contact between the second anode and the first anode for avoiding the problem that the second anode and the first anode are in bad contact due to the poor welding for stabilizing the luminous performance of the light emitting diode to promote the display quality of the light emitting diode display; furthermore, the present application uses ink jet printing to form the anode contact layer and the cathode insulation layer, and the manufacture process is simple and the production cost is low. The light emitting diode display provided by the present invention arranges the anode contact layer to make the luminous performance of the light emitting diode stable to possess the better display quality.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings,

FIG. 2 is a flowchart of a manufacture method of a light emitting diode display according to the present invention;

DETAILED DESCRIPTION OF PREFERRED EMBODIMENTS

For better explaining the technical solution and the effect of the present invention, the present invention will be further described in detail with the accompanying drawings and the specific embodiments.

Figure 1:
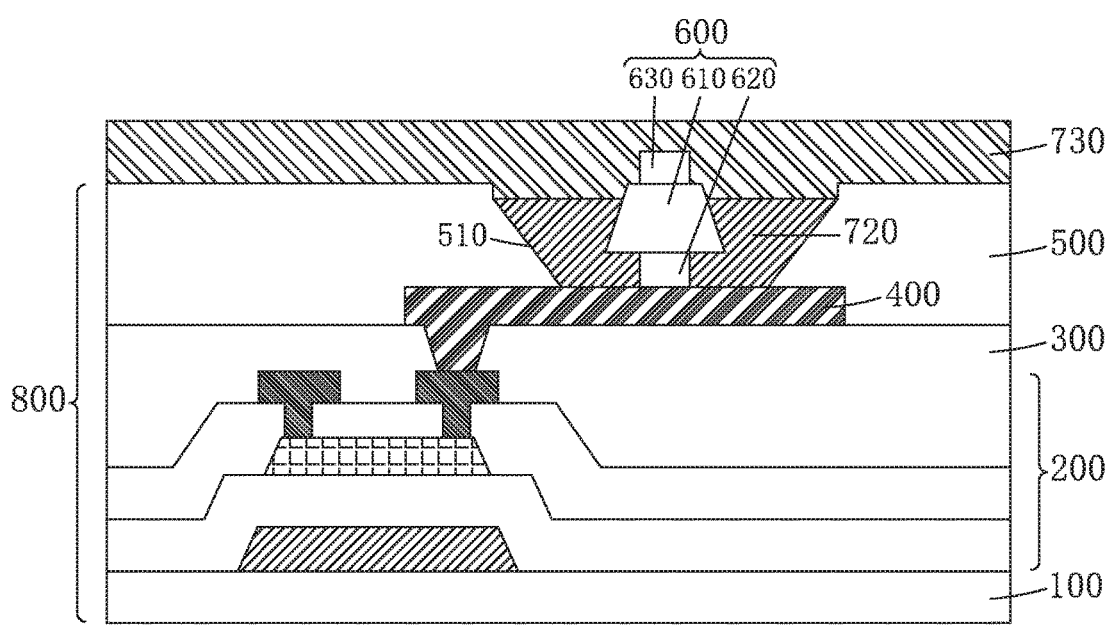
FIG. 1 is a structure diagram of a light emitting diode display according to prior art.
Figure 3:
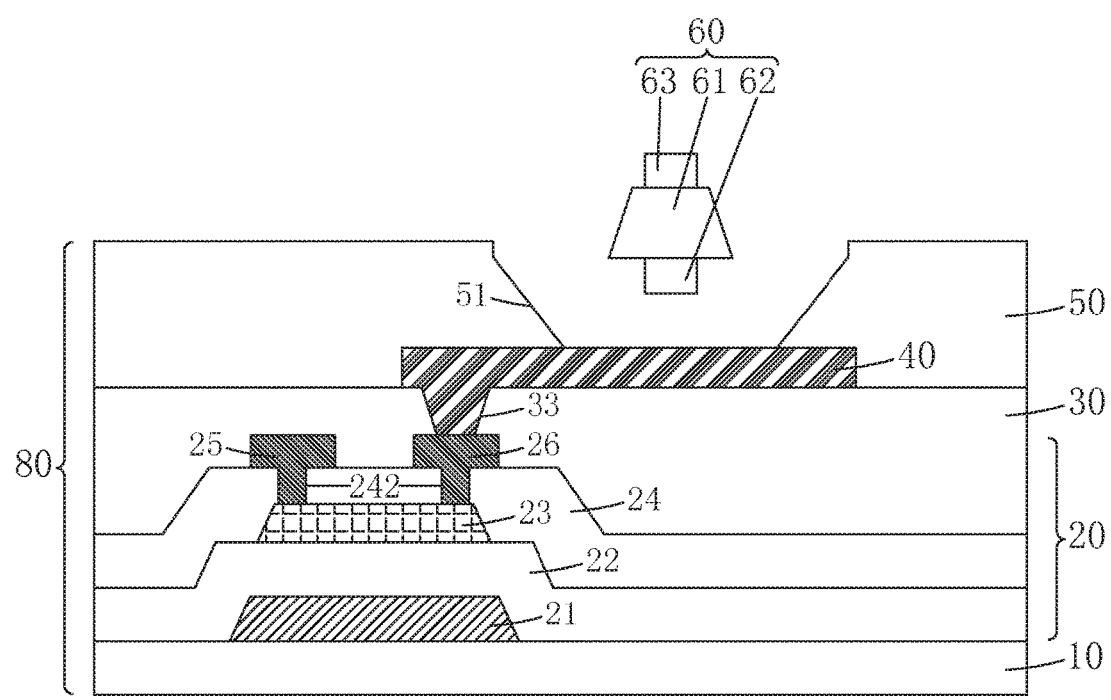
FIG. 3 is a diagram of step 1 of a manufacture method of a light emitting diode display according to the present invention.

Please refer to FIG. 2, the present invention first provides a manufacture method of a light emitting diode display, comprising steps of:

step 1, as shown in FIG. 3, providing a TFT backplate 80 and a light emitting diode 60;

the TFT backplate 80 comprising a substrate 10, a TFT layer 20 located on the substrate 10, a first planarization layer 30 located on the TFT layer 20, a first anode 40 located on the first planarization layer 30, a second planarization layer 50 located on the first anode 40 and the first planarization layer 30 and a first through hole 51 being located on the second planarization layer 20 and exposing at least a portion of the first anode 40;

the light emitting diode 60 comprising a luminous lamp 61 and a second anode 62 and a second cathode 63 respectively connected to two ends of the luminous lamp 61.

Specifically, the first anode 40 is a reflective electrode.

Specifically, a material of the first anode 40 is metal.

Preferably, the material of the first anode 40 comprises one or more of molybdenum (Mo), aluminum (Al), copper (Cu), titanium (Ti) and chromium (Cr).

Figure 4:
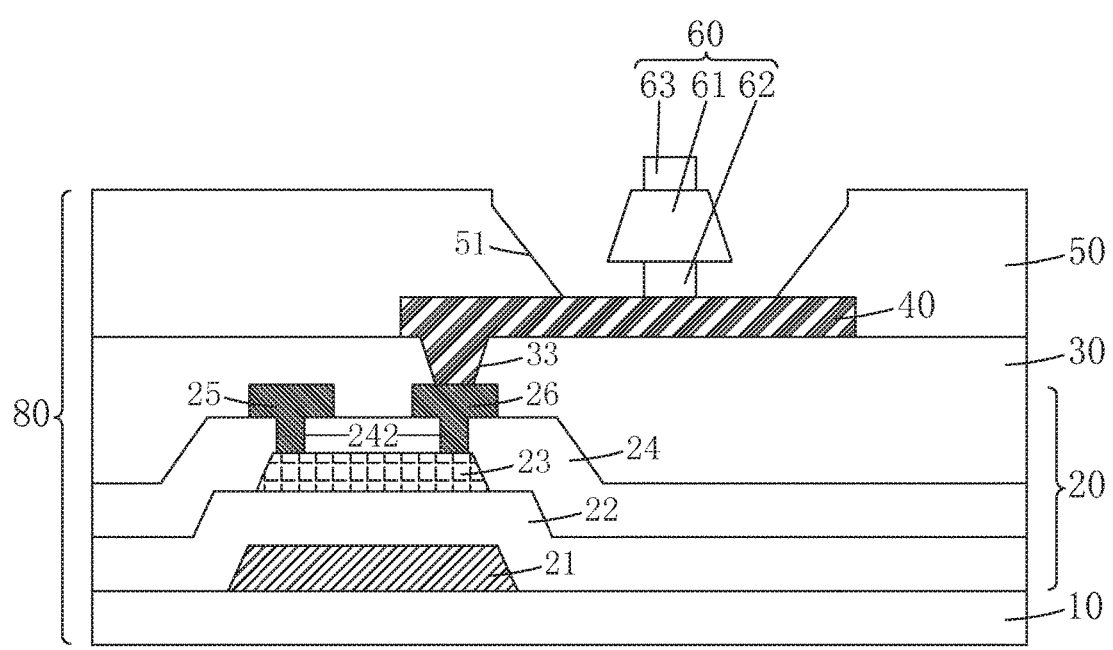
FIG. 4 is a diagram of step 2 of a manufacture method of a light emitting diode display according to the present invention.

Specifically, the TFT layer 20 comprises a gate 21 located on the substrate 10, a gate protection layer 22 on the gate 21 and the substrate 10, an active layer 23 located on the gate protection layer 22, an etching stopper layer 24 located on the active layer 23 and the gate protection layer 22, and a source 25 and a drain 26 located on the etching stopper layer 24, and second through holes 242 respectively corresponding to two ends of the active layer 23 are configured in the etching stopper layer 24, and the source 25 and the drain 26 contact with the two ends of the active layer 23 respectively via the second through holes 242;

a third through hole 33 is configured on the first planarization layer 30, and the first anode 40 contacts with the drain 26 via the third through hole 33.

step 2, as shown in FIG. 4, transferring the light emitting diode 60 into the first through hole 51 of the TFT backplate 80, and connecting the second anode 62 of the light emitting diode 60 with the first anode 40 of the TFT backplate 80.

Figure 5:
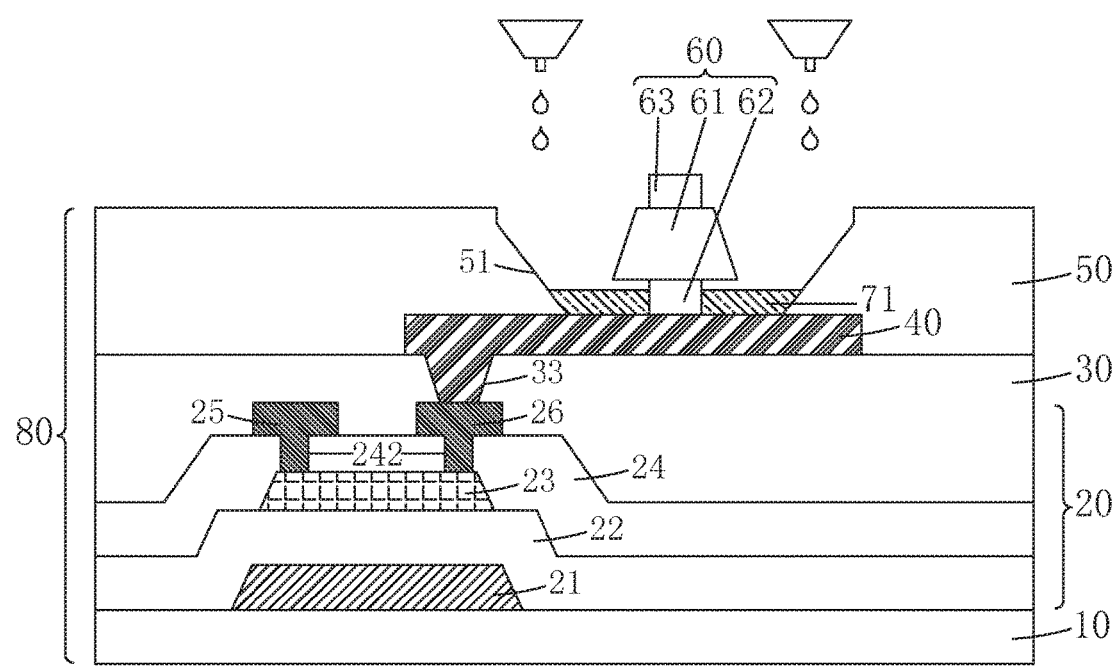
FIG. 5 is a diagram of step 3 of a manufacture method of a light emitting diode display according to the present invention.

Specifically, in step 2, welding is used to connect the second anode 62 of the light emitting diode 60 with the first anode 40 of the TFT backplate 80.

step 3, as shown in FIG. 5, forming an anode contact layer 71, which is around the light emitting diode 60 and on the first anode 40, inside the first through hole 51 of the TFT backplate 80; the anode contact layer 71 contacting with the second anode 62 and not contacting with the second cathode 63.

By arranging the anode contact layer 71 to increase the contact area of the second anode 62 of the light emitting diode 60 and the first anode 40 of the TFT backplate 80 to ensure the fine contact between the second anode 62 and the second anode 40 for avoiding the problem that the second anode 62 and the first anode 40 are in bad contact due to the poor welding for stabilizing the luminous performance of the light emitting diode 60 to promote the display quality of the light emitting diode display.

Specifically, in step 3, ink jet printing is used to form the anode contact layer 71.

Figure 6:
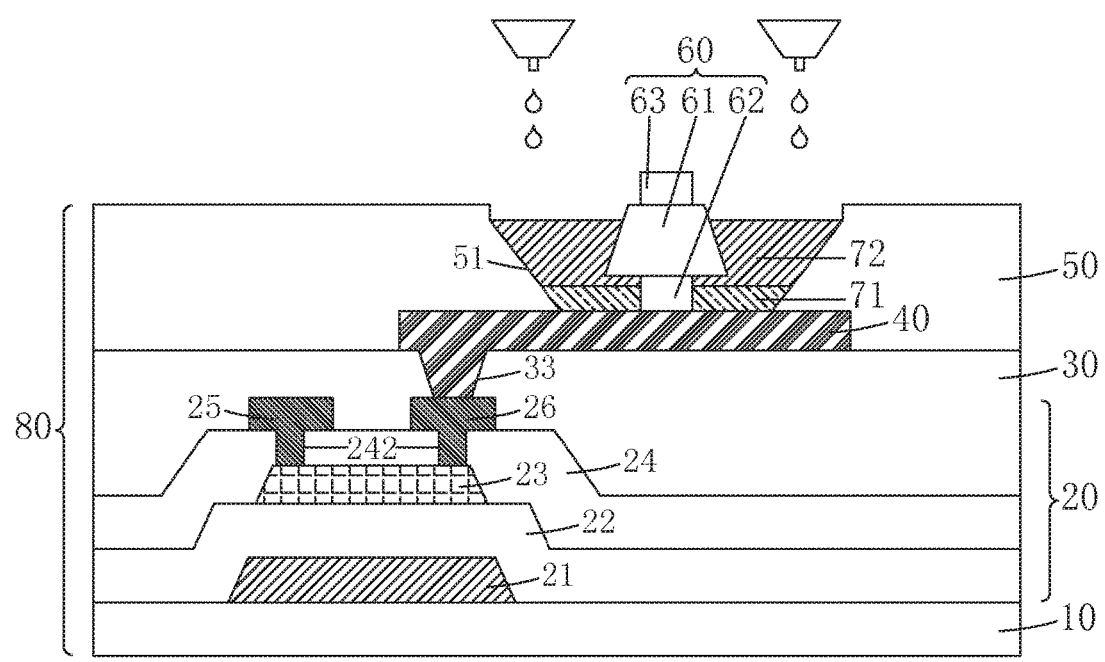
FIG. 6 is a diagram of step 4 of a manufacture method of a light emitting diode display according to the present invention.

Preferably, a material of the anode contact layer 71 comprises one or more of nano silver and nano copper.

step 4, as shown in FIG. 6, forming a cathode insulation layer 72, which is around the light emitting diode 60 and on the anode contact layer 71, inside the first through hole 51 of the TFT backplate 80.

The cathode insulation layer 72 is insulation material. Thus, the anode contact layer 71 can be insulated from the first cathode 73 manufactured thereafter to prevent the short circuit.

Specifically, in step 4, ink jet printing is used to form the cathode insulation layer 72.

Preferably, a material of the cathode insulation layer 72 is organic insulation material.

Figure 7:
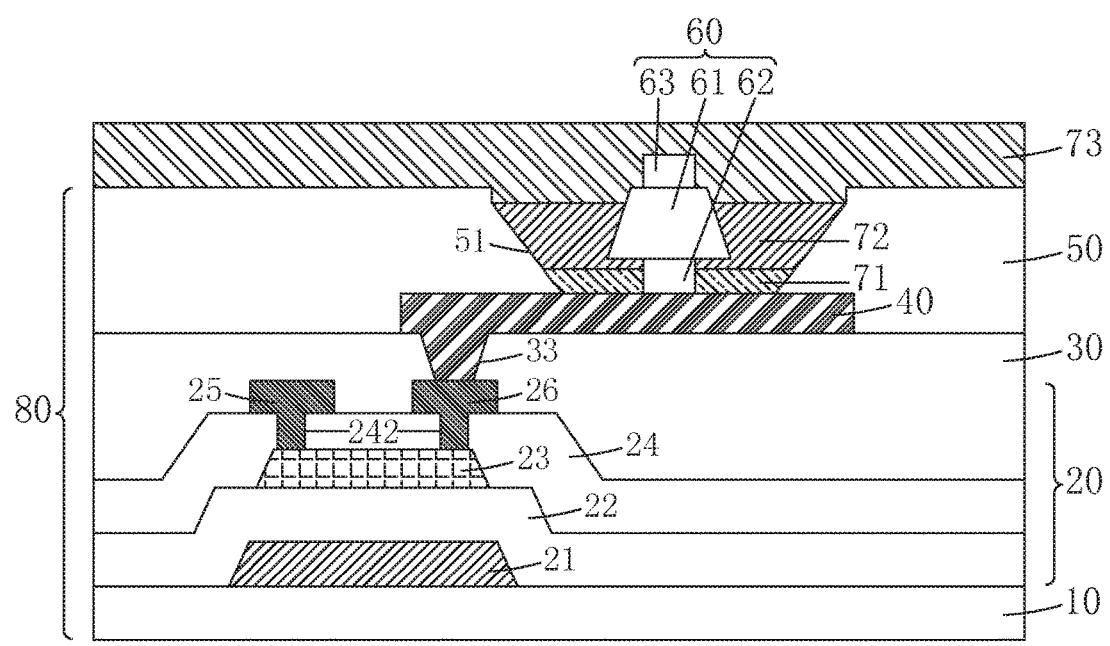
FIG. 7 is a diagram of step 5 of a manufacture method of a light emitting diode display according to the present invention and also a structure diagram of a light emitting diode display according to the present invention.

The present invention uses the ink jet printing to form the cathode insulation layer 72. In comparison with prior art, the mask cost is saved, and the production cost is low, and the manufacture process is simple, production efficiency is high.

step 5, as shown in FIG. 7, forming a first cathode 73 on the cathode insulation layer 72, the light emitting diode 60 and the second planarization layer 50, and the first cathode 73 contacting with the second cathode 63.

Specifically, in step 5, evaporation is used to form the first cathode 73.

Specifically, the first anode 73 is a transparent electrode.

Preferably, a material of the first cathode 73 is transparent conductive metal oxide, such as indium tin oxide (ITO).

Under the circumstance that the first anode 40 is a reflective electrode and the first anode 73 is a transparent electrode, the light emitting diode of the present invention constructs the top emitting light emitting diode display, and one side of the first anode 73 is the illuminating surface.

The aforesaid manufacture method of the light emitting diode display arranges an anode contact layer 71 to increase the contact area of the second anode 62 of the light emitting diode 60 and the first anode 40 of the TFT backplate 80 to ensure the fine contact between the second anode 62 and the first anode 40 for avoiding the problem that the second anode 62 and the first anode 40 are in bad contact due to the poor welding for stabilizing the luminous performance of the light emitting diode 60 to promote the display quality of the light emitting diode display; furthermore, the present application uses ink jet printing to form the anode contact layer 71 and the cathode insulation layer 72, and the manufacture process is simple and the production cost is low.

Please refer to FIG. 7. On the basis of the aforesaid manufacture method of the light emitting diode display, the present invention further provides a light emitting diode display, comprising a substrate 10, a TFT layer 20 located on the substrate 10, a first planarization layer 30 located on the TFT layer 20, a first anode 40 located on the first planarization layer 30, a second planarization layer 50 located on the first anode 40 and the first planarization layer 30, a first through hole 51 being located in the second planarization layer 50 and exposing at least a portion of the first anode 40, a light emitting diode 60 located inside the first through hole 51, an anode contact layer 71, which is around the light emitting diode 60 and on the first anode 40, located inside the first through hole 51, a cathode insulation layer 72, which is around the light emitting diode 60 and on the anode contact layer 71, located inside the first through hole 51, and a first cathode 73 located on the cathode insulation layer 72, the light emitting diode 60 and the second planarization layer 50;

the light emitting diode 60 comprising a luminous lamp 61 and a second anode 62 and a second cathode 63 respectively connected to two ends of the luminous lamp 61, and the second anode 62 connecting with the first anode 40, and the second cathode 63 contacting with the first cathode 73;

the anode contact layer 71 contacting with the second anode 62 and not contacting with the second cathode 63; the anode contact layer 71 and the first cathode 73 are insulated by the cathode insulation layer 72.

Specifically, the TFT layer 20 comprises a gate 21 located on the substrate 10, a gate protection layer 22 on the gate 21 and the substrate 10, an active layer 23 located on the gate protection layer 22, an etching stopper layer 24 located on the active layer 23 and the gate protection layer 22, and a source 25 and a drain 26 located on the etching stopper layer 24, and second through holes 242 respectively corresponding to two ends of the active layer 23 are configured in the etching stopper layer 24, and the source 25 and the drain 26 contact with the two ends of the active layer 23 respectively via the second through holes 242;

a third through hole 33 is configured on the first planarization layer 30, and the first anode 40 contacts with the drain 26 via the third through hole 33.

Specifically, the first anode 40 is a reflective electrode.

Specifically, a material of the first anode 40 is metal.

Preferably, the material of the first anode 40 comprises one or more of molybdenum (Mo), aluminum (Al), copper (Cu), titanium (Ti) and chromium (Cr).

Preferably, a material of the anode contact layer 71 comprises one or more of nano silver and nano copper.

Preferably, a material of the cathode insulation layer 72 is organic insulation material.

Specifically, the first anode 73 is a transparent electrode.

Preferably, a material of the first cathode 73 is transparent conductive metal oxide, such as indium tin oxide (ITO).

The aforesaid light emitting diode display arranges the anode contact layer 71 to increase the contact area of the second anode 62 of the light emitting diode 60 and the first anode 40 of the TFT backplate 80 to ensure the fine contact between the second anode 62 and the second anode 40 for avoiding the problem that the second anode 62 and the first anode 40 are in bad contact due to the poor welding for stabilizing the luminous performance of the light emitting diode 60 to possess the better display quality.

In conclusion, the present invention provides a light emitting diode display and a manufacture method thereof. The manufacture method of the light emitting diode display according to the present invention arranges an anode contact layer to increase the contact area of the second anode of the light emitting diode and the first anode of the TFT backplate to ensure the fine contact between the second anode and the first anode for avoiding the problem that the second anode and the first anode are in bad contact due to the poor welding for stabilizing the luminous performance of the light emitting diode to promote the display quality of the light emitting diode display; furthermore, the present application uses ink jet printing to form the anode contact layer and the cathode insulation layer, and the manufacture process is simple and the production cost is low. The light emitting diode display of the present invention arranges the anode contact layer to make the luminous performance of the light emitting diode stable to possess the better display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a light emitting diode display, comprising steps of:

step 1, providing a TFT backplate and a light emitting diode;

the TFT backplate comprising a substrate, a TFT layer located on the substrate, a first planarization layer located on the TFT layer, a first anode located on the first planarization layer, a second planarization layer located on the first anode and the first planarization layer and a first through hole being located on the second planarization layer and exposing at least a portion of the first anode;

the light emitting diode comprising a luminous lamp and a second anode and a second cathode respectively connected to two ends of the luminous lamp;

step 2, transferring the light emitting diode into the first through hole of the TFT backplate, and connecting the second anode of the light emitting diode with the first anode of the TFT backplate;

step 3, forming an anode contact layer, which is around the light emitting diode and on the first anode, inside the first through hole of the TFT backplate; the anode contact layer contacting with the second anode and not contacting with the second cathode;

step 4, forming a cathode insulation layer, which is around the light emitting diode and on the anode contact layer, inside the first through hole of the TFT backplate;

step 5, forming a first cathode on the cathode insulation layer, the light emitting diode and the second planarization layer, and the first cathode contacting with the second cathode.

2. The manufacture method of the light emitting diode display according to claim 1, wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

a third through hole is configured on the first planarization layer, and the first anode contacts with the drain via the third through hole.

3. The manufacture method of the light emitting diode display according to claim 1, wherein in step 2, welding is used to connect the second anode of the light emitting diode with the first anode of the TFT backplate.

4. The manufacture method of the light emitting diode display according to claim 1, wherein in step 3, ink jet printing is used to form the anode contact layer; a material of the anode contact layer comprises one or more of nano silver and nano copper.

5. The manufacture method of the light emitting diode display according to claim 1, wherein in step 4, ink jet printing is used to form the cathode insulation layer; a material of the cathode insulation layer is organic insulation material.

6. The manufacture method of the light emitting diode display according to claim 1, wherein in step 5, evaporation is used to form the first cathode; the first anode is a reflective electrode; the first cathode is a transparent electrode.

7. A light emitting diode display, comprising a substrate, a TFT layer located on the substrate, a first planarization layer located on the TFT layer, a first anode located on the first planarization layer, a second planarization layer located on the first anode and the first planarization layer, a first through hole being located on the second planarization layer and exposing at least a portion of the first anode, a light emitting diode located inside the first through hole, an anode contact layer, which is around the light emitting diode and on the first anode, located inside the first through hole, a cathode insulation layer, which is around the light emitting diode and on the anode contact layer, located inside the first through hole, and a first cathode located on the cathode insulation layer, the light emitting diode and the second planarization layer;

the light emitting diode comprising a luminous lamp and a second anode and a second cathode respectively connected to two ends of the luminous lamp, and the second anode connecting with the first anode, and the second cathode contacting with the first cathode;

the anode contact layer contacting with the second anode and not contacting with the second cathode; the anode contact layer and the first cathode are insulated by the cathode insulation layer.

8. The light emitting diode display according to claim 7, wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

a third through hole is configured on the first planarization layer, and the first anode contacts with the drain via the third through hole.

9. The light emitting diode display according to claim 7, wherein a material of the anode contact layer comprises one or more of nano silver and nano copper; a material of the cathode insulation layer is organic insulation material.

10. The light emitting diode display according to claim 7, wherein the first anode is a reflective electrode; the first cathode is a transparent electrode.

11. A manufacture method of a light emitting diode display, comprising steps of:

step 1, providing a TFT backplate and a light emitting diode;

the TFT backplate comprising a substrate, a TFT layer located on the substrate, a first planarization layer located on the TFT layer, a first anode located on the first planarization layer, a second planarization layer located on the first anode and the first planarization layer and a first through hole being located on the second planarization layer and exposing at least a portion of the first anode;

the light emitting diode comprising a luminous lamp and a second anode and a second cathode respectively connected to two ends of the luminous lamp;

step 2, transferring the light emitting diode into the first through hole of the TFT backplate, and connecting the second anode of the light emitting diode with the first anode of the TFT backplate;

step 3, forming an anode contact layer, which is around the light emitting diode and on the first anode, inside the first through hole of the TFT backplate; the anode contact layer contacting with the second anode and not contacting with the second cathode;

step 4, forming a cathode insulation layer, which is around the light emitting diode and on the anode contact layer, inside the first through hole of the TFT backplate;

step 5, forming a first cathode on the cathode insulation layer, the light emitting diode and the second planarization layer, and the first cathode contacting with the second cathode;

wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

a third through hole is configured on the first planarization layer, and the first anode contacts with the drain via the third through hole;

wherein in step 2, welding is used to connect the second anode of the light emitting diode with the first anode of the TFT backplate.

12. The manufacture method of the light emitting diode display according to claim 11, wherein in step 3, ink jet printing is used to form the anode contact layer; a material of the anode contact layer comprises one or more of nano silver and nano copper.

13. The manufacture method of the light emitting diode display according to claim 11, wherein in step 4, ink jet printing is used to form the cathode insulation layer; a material of the cathode insulation layer is organic insulation material.

14. The manufacture method of the light emitting diode display according to claim 11, wherein in step 5, evaporation is used to form the first cathode; the first anode is a reflective electrode; the first cathode is a transparent electrode.

* * * * *